US011527883B2

(12) United States Patent
Liu et al.

(10) Patent No.: US 11,527,883 B2
(45) Date of Patent: Dec. 13, 2022

(54) POWER PROTECTION APPARATUS AND TERMINAL USING THE APPARATUS

(71) Applicant: HUAWEI TECHNOLOGIES CO., LTD., Guangdong (CN)

(72) Inventors: Xinyu Liu, Shenzhen (CN); Yanding Liu, Shenzhen (CN); Ce Liu, Shenzhen (CN); Pinghua Wang, Shenzhen (CN); Yong Cao, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 18 days.

(21) Appl. No.: 16/825,061

(22) Filed: Mar. 20, 2020

(65) Prior Publication Data
US 2020/0220346 A1 Jul. 9, 2020

Related U.S. Application Data

(63) Continuation of application No. PCT/CN2018/106907, filed on Sep. 21, 2018.

(30) Foreign Application Priority Data

Sep. 23, 2017 (CN) .......................... 201710870503.8

(51) Int. Cl.
H02H 7/18 (2006.01)
H02J 7/00 (2006.01)

(52) U.S. Cl.
CPC ............ *H02H 7/18* (2013.01); *H02J 7/0031* (2013.01); *H02J 7/00304* (2020.01)

(58) Field of Classification Search
CPC .... H02H 7/18; H02H 7/00304; H02H 7/0031; H02H 3/087; G01R 19/165; G01R 19/16519

(Continued)

(56) References Cited

U.S. PATENT DOCUMENTS 7,471,066 B2* 12/2008 Ambrosio ............. H02J 7/0014
320/112
2005/0189981 A1* 9/2005 Matsunaga ............ H02H 3/087
327/436

(Continued)

FOREIGN PATENT DOCUMENTS

CN 102208802 A 10/2011
CN 102355018 A 2/2012

(Continued)

*Primary Examiner* — Thienvu V Tran
*Assistant Examiner* — Sreeya Sreevatsa
(74) *Attorney, Agent, or Firm* — Womble Bond Dickinson (US) LLP

(57) ABSTRACT

A battery protection apparatus power protection apparatus is configured to protect an electrochemical cell connected to a load, and includes a protection IC, a switching transistor group, and a sampling resistor. The protection IC includes two power input terminals respectively connected to positive and negative electrodes of the electrochemical cell, and an operational amplifier, where the operational amplifier includes a positive input pin, a negative input pin, and an output pin. The switching transistor group is connected between the negative electrode of the electrochemical cell and the load, and is configured to control turn-on and turn-off of a charge and discharge circuit of the electrochemical cell. The sampling detection resistor Rs is serially connected between the sampling circuit detection terminal and the output pin, where the main circuit detection terminal is connected to the positive input pin, and the sampling circuit detection terminal is connected to the negative input pin.

20 Claims, 7 Drawing Sheets

(58) Field of Classification Search
USPC .......................................................... 361/101
See application file for complete search history.

(56) References Cited

U.S. PATENT DOCUMENTS

| | | | |
|---|---|---|---|
| 2009/0039869 A1* | 2/2009 | Williams | ............... H01L 24/48 |
| | | | 324/123 R |
| 2012/0187899 A1 | 7/2012 | Ozaki | |
| 2014/0021979 A1 | 1/2014 | Huang | |
| 2016/0164311 A1 | 6/2016 | Nagata et al. | |

FOREIGN PATENT DOCUMENTS

| | | |
|---|---|---|
| CN | 103187712 A | 7/2013 |
| CN | 103529276 A | 1/2014 |
| CN | 103575964 A | 2/2014 |
| CN | 103633617 A | 3/2014 |
| CN | 203713590 U | 7/2014 |
| CN | 104218633 A | 12/2014 |
| CN | 204068213 U | 12/2014 |
| CN | 204465038 U | 7/2015 |
| CN | 204666703 U | 9/2015 |
| CN | 204794046 U | 11/2015 |
| CN | 205029381 U | 2/2016 |
| CN | 205231808 U | 5/2016 |
| CN | 105680422 A | 6/2016 |
| CN | 103954825 B | 8/2016 |
| CN | 105846493 A | 8/2016 |
| CN | 104022490 B | 3/2017 |
| CN | 104682429 B | 4/2017 |
| CN | 206516635 U | 9/2017 |
| CN | 107579508 A | 1/2018 |
| CN | 108063428 A | 5/2018 |
| JP | 2004282894 A | 10/2004 |
| JP | 2010181351 A | 8/2010 |
| JP | 2013183539 A | 9/2013 |
| JP | 2017011982 A | 1/2017 |

* cited by examiner

POWER PROTECTION APPARATUS AND TERMINAL USING THE APPARATUS

CROSS-REFERENCE TO RELATED APPLICATIONS

This application is a continuation of International Application No. PCT/CN2018/106907, filed on Sep. 21, 2018, which claims priority to Chinese Patent Application No. 201710870503.8, filed on Sep. 23, 2017. The disclosures of the aforementioned applications are hereby incorporated by reference in their entireties.

TECHNICAL FIELD

Embodiments of the present invention relate to the circuit field, and more specifically, to a power protection apparatus and a terminal using the apparatus.

BACKGROUND

Currently, fast charge of a terminal has become a common customer need. A fast charge technology used by the terminal has become a current hot technology. However, heat emitted due to fast charge is also a problem of the whole industry. When a charge current doubles, an amount of heat caused by same charge circuit impedance increases by three times.

When lithium-ion batteries used by some common terminals are used, a protection circuit packaged inside the battery and serially connected to an electrochemical cell is needed to monitor charge overvoltage, discharge undervoltage, charge overcurrent, and discharge overcurrent of the lithium-ion battery. For discharge overcurrent, not only a requirement for LPS (Limited power sources) certification in related specifications needs to be satisfied, that is, when a current is 8 amperes, a semiconductor switch (MOS) transistor needs to be turned off within five seconds to implement power-off protection, but also a requirement needs to be satisfied that a mobile phone is not powered off within 60 seconds when a pulse load current is 5 amperes, within five seconds when a pulse load current is 6 amperes, or within two seconds when a pulse load current is 7 amperes.

In existing methods for detecting a current of a battery protection circuit, a common method is: performing overcurrent detection by using impedance of a resistor of a MOS transistor of a charge and discharge circuit, and triggering an overcurrent detection comparator inside a protection IC of a lithium-ion battery by using a voltage drop formed after a current passes through the resistor of the MOS transistor of the discharge and discharge circuit. However, the impedance of the resistor of the MOS transistor is not a constant value and varies with conditions. When fast charge is implemented by using a high current, breakover voltages at both terminals of the MOS transistor are relatively high and change in a relatively large range. As a result, the impedance of the resistor of the MOS transistor also changes greatly, and a high-precision requirement cannot be satisfied.

In the existing methods for detecting a current of a battery protection circuit, another common method is: disposing a dedicated current sampling resistor for a charge and discharge circuit, performing overcurrent detection by using the current sampling resistor, and triggering an overcurrent detection comparator inside a protection integrated circuit (IC) of a battery by using a voltage drop formed after a current passes through the current sampling resistor RS of the charge and discharge circuit.

However, because the additional current sampling resistor is introduced, impedance of the charge and discharge circuit increases. When fast charge is implemented by using a high current, the current sampling resistor also generates heat, causing temperature of the charge and discharge circuit to increase remarkably.

Therefore, currently, when fast charge of a battery is implemented by using a high current, there lacks an effective solution to ensure efficiently high overcurrent detection precision without causing extra through-current impedance of a charge and discharge circuit.

SUMMARY

Embodiments of the present application provide a power protection apparatus and a terminal using the apparatus, to resolve a problem that through-current circuit impedance is too high and overcurrent detection precision is not high enough during high-current fast charge of a battery in a power protection apparatus.

According to a first aspect, an embodiment of the present application provides a battery protection apparatus power protection apparatus. The apparatus is configured to protect an electrochemical cell connected to a load, and includes a protection IC, a switching transistor group, and a sampling resistor. The protection IC includes two power input terminals respectively connected to positive and negative electrodes of the electrochemical cell, and an operational amplifier, where the operational amplifier includes a positive input pin, a negative input pin, and an output pin. The switching transistor group is connected between the negative electrode of the electrochemical cell and the load, and is configured to control turn-on and turn-off of a charge and discharge circuit of the electrochemical cell; the switching transistor group includes a main circuit and a sampling circuit; and the switching transistor group includes a first connection terminal connected to the negative electrode of the electrochemical cell, a second connection terminal connected to the load, a least one control terminal, a sampling circuit detection terminal, and a main circuit detection terminal, where the control terminal is connected to the protection IC, and is configured to receive a control signal of the protection IC to control turn-off of the switching transistor group to implement protection against an abnormality of the electrochemical cell. The sampling detection resistor Rs is serially connected between the sampling circuit detection terminal and the output pin, and is configured to detect a current of the sampling circuit. The main circuit detection terminal is connected to the positive input pin, the sampling circuit detection terminal is connected to the negative input pin, and the operational amplifier is mainly configured to enable a voltage of a main circuit part of the switching transistor group to be the same as a voltage at a connection point between the main circuit part and the operational amplifier, so that a current passing through the main circuit is equally proportional to a current passing through the sampling circuit. Equivalently, the first connection terminal and the second connection terminal are respectively connected to a charge-specific input terminal and output terminal of the main circuit part of the switching transistor group, or to a discharge-specific output terminal and input terminal of the main circuit part of the switching transistor group. In other words, the main circuit part of the switching transistor group is a part of the charge and discharge circuit of the electrochemical cell. A current in the charge and discharge circuit passes through the main circuit mainly through the first connection terminal and the second connection terminal.

It can be understood that in some embodiments, another component may be used to enable a voltage of the sampling circuit detection terminal to be the same as a voltage of the main circuit detection terminal. Therefore, this embodiment of the present application is not limited to the operational amplifier. The operational amplifier is merely a name given based on an existing technology and cognition, and any component or integrated circuit having a similar function shall be equivalent to the operational amplifier.

The protection apparatus mainly performs, by using a current imaging function of a detection field effect transistor of the switching transistor group, imaging on a current in the main through-current circuit based on a given proportional coefficient 1/K to obtain a very low current. The protection IC detects the very low current obtained through imaging, then multiplies the very low current by a proportional coefficient K, to obtain a value of the current in the main through-current circuit, and finally determines, based on the value, whether charge overcurrent or discharge overcurrent occurs. Further, the protection IC turns off a charge switch or a discharge switch to implement a function of charge overcurrent protection or discharge overcurrent protection.

In one embodiment, the operational amplifier is configured to enable the negative input pin and the positive input pin to have a same potential, that is, enable the sampling circuit detection terminal and the main circuit detection terminal of the switching transistor group to have a same potential, so that the current passing through the sampling circuit is equally proportional to the current passing through the main circuit, where a current passing through the first connection terminal and the second connection terminal is equal to the current of the main circuit.

In one embodiment, the switching transistor group includes (X+KX) switching transistor units that are connected in parallel; X switching transistor units are connected in parallel to constitute the sampling circuit; KX transistors are connected in parallel to constitute the main circuit; and a ratio of the current passing through the sampling circuit to the current passing through the main circuit is equal to a ratio of a quantity of switching transistor units of the sampling circuit to a quantity of switching transistor units of the main circuit, that is, is equal to 1:K, where X is an integer greater than or equal to 1, K is greater than 1, and KX is an integer.

In one embodiment, the switching transistor group includes sampling circuit output terminals $SS_1$ and $SS_2$, and main circuit detection output terminals $S_{1k}$ and $S_{2k}$, where the $S_{1k}$ is connected to the positive input pin of the operational amplifier, the $SS_1$ is connected to both the negative input pin and the output pin of the operational amplifier, and the sampling detection resistor Rs is serially connected between the $SS_1$ and the output pin of the operational amplifier.

In one embodiment, the protection IC further includes a secondary operational amplifier, the $S_{2k}$ is connected to a positive input pin of the secondary operational amplifier, the $SS_2$ is connected to both a negative input pin and an output pin of the secondary operational amplifier, and the power protection apparatus further includes a sampling detection resistor R2 that is serially connected between the $SS_2$ and the output pin of the secondary operational amplifier.

In one embodiment, the sampling circuit detection terminal includes sampling circuit output terminals $SS_1$ and $SS_2$, and sampling detection output terminals $SS_{1k}$ and $SS_{2k}$, and the main circuit detection terminal includes main circuit detection output terminals $S_{1k}$ and $S_{2k}$, where the $S_{2k}$ is connected to the positive input pin of a operational amplifier, the $SS_1$ is connected to the output pin of the operational amplifier, the $SS_{1k}$ is connected to the negative input pin of the operational amplifier, and the sampling detection resistor Rs is serially connected between the $SS_1$ and the output pin of the operational amplifier.

In one embodiment, the protection IC further includes a secondary operational amplifier, the $S_{2k}$ is connected to a positive input pin of the secondary operational amplifier, the $SS_2$ is connected to an output pin of the secondary operational amplifier, the $SS_{2k}$ is connected to a negative input pin of the secondary operational amplifier, and the power protection apparatus further includes a sampling detection resistor R2 that is serially connected between the $SS_2$ and the output pin of the secondary operational amplifier.

In one embodiment, each switching transistor unit includes a first switching transistor Sa and a second switching transistor Sb that is serially connected to the Sa reversely, each Sa or Sb is connected to a diode D1 in parallel, the Sa is a discharge switching transistor and the Sb is a charge switching transistor, the X switching transistor units are connected in parallel to constitute the sampling circuit, and the KX switching transistor units are connected in parallel to constitute the main circuit.

In one embodiment, D electrodes of all Sa's and Sb's are connected together, G electrodes of all Sa's of the (X+KX) switching transistor units are connected together to constitute a discharge control terminal G1, G electrodes of all Sb's of the (X+KX) switching transistor units are connected together to constitute a charge control terminal G2, S electrodes of all Sa's of the X switching transistor units constituting the sampling circuit are connected to a same pin to constitute the sampling circuit output terminal $SS_1$, S electrodes of all Sb's of the X switching transistor units are connected to a same pin to constitute the sampling circuit output terminal $SS_2$, S electrodes of all Sa's of the KX switching transistor units constituting the main circuit are connected to a same pin to constitute the first connection terminal $S_1$ of the switching transistor group, and S electrodes of all Sb's of the X switching transistor units are connected to a same pin to constitute the second connection terminal $S_2$ of the switching transistor group.

In one embodiment, the $SS_{1k}$ is constituted by directly connecting the S electrodes on wafers of all the Sa's of the X switching transistor units of the sampling circuit by using a high-conductivity metal wire, the $SS_{2k}$ is constituted by directly connecting the S electrodes on wafers of all the Sb's of the X switching transistor units of the sampling circuit by using a high-conductivity metal, the detection output terminal $S_{1k}$ of the main circuit is constituted by directly connecting the S electrodes on wafers of all the Sa's of the KX switching transistor units of the main circuit by using a high-conductivity metal wire, and the $S_{2k}$ is constituted by directly connecting the S electrodes on wafers of all the Sb's of the KX switching transistor units of the main circuit by using a high-conductivity metal.

In one embodiment, the at least one control terminal includes the discharge control terminal G1 configured to control turn-off of the switching transistor group during discharge, and the charge control terminal G2 configured to control turn-off of the switching transistor group during charge, and at least one charge and discharge protection terminal of the protection IC includes a discharge protection terminal DO connected to the discharge control terminal G1, and a charge protection terminal CO connected to the charge control terminal G2.

In one embodiment of the present application, charge overvoltage protection, discharge undervoltage protection, charge overcurrent protection, and discharge overcurrent protection of a battery are implemented by using the switching transistor group and the protection IC. A current imaging function of a detection field effect transistor is used to perform imaging on a current in the main through-current circuit based on a given proportional coefficient 1/K to obtain a very low current. The protection IC detects the very low current obtained through imaging, and then multiplies the very low current by a proportional coefficient K, to obtain a value of the current in the main through-current circuit. The sampling detection resistor Rs is serially connected between the sampling detection output terminal and the output pin, and is not disposed on the charge and discharge circuit. In addition, a detection current passing through the sampling detection resistor Rs is 1/K of the current in the charge and discharge circuit, far less than the current in the charge and discharge circuit. Therefore, heat generated by the sampling detection resistor Rs is very small, and basically has no actual impact on temperature of the charge and discharge circuit.

According to a second aspect, an embodiment of the present application provides a power protection apparatus. The apparatus is configured to protect an electrochemical cell connected to a load, and includes a protection IC, a switching transistor group, and a sampling detection resistor Rs. The protection IC includes two power input terminals respectively connected to positive and negative electrodes of the electrochemical cell, a positive current detection terminal, a negative current detection terminal, and a current sampling detection output terminal. The switching transistor group is connected between the negative electrode of the electrochemical cell and the load, and is configured to control turn-on and turn-off of a charge and discharge circuit of the electrochemical cell; the switching transistor group includes a main circuit and a sampling circuit; and the switching transistor group includes a first connection terminal connected to the negative electrode of the electrochemical cell, a second connection terminal connected to the load, a control terminal, a sampling circuit detection terminal, and a main circuit detection terminal, where the control terminal is connected to the protection IC, and is configured to receive a control signal of the protection IC to control turn-off of the switching transistor group to implement protection against an abnormality of the electrochemical cell. The sampling detection resistor Rs is serially connected between the sampling circuit detection terminal and the current sampling detection output terminal, and is configured to detect a current of the sampling circuit, where the main circuit detection terminal is connected to the positive input pin, and the sampling circuit detection terminal is connected to the negative current detection terminal. The protection IC may be configured to enable a voltage of the sampling circuit detection terminal to be the same as a voltage of the main circuit detection terminal, so that a current passing through the main circuit is equally proportional to the current passing through the sampling circuit. It can be understood that in some embodiments, another component may be used to enable the voltage of the sampling circuit detection terminal to be the same as the voltage of the main circuit detection terminal. Therefore, this embodiment of the present application is not limited to the protection IC. The protection IC is merely a name given based on an existing technology and cognition, and any component or integrated circuit having a similar function shall be equivalent to the protection IC.

According to a third aspect, an embodiment of the present application provides a battery, including an electrochemical cell, and the battery protection apparatus power protection apparatus according to any one of the first aspect, the second aspect, or the implementations of the first aspect, where the apparatus is configured to protect the electrochemical cell.

According to a fourth aspect, an embodiment of the present application provides a terminal, including a charge connector, a charge management chip, a battery, and a load, where the charge connector is configured to connect to a charge cable, the charge management chip is connected between the charge connector and the battery and is configured to control a charge process of the battery, the battery is configured to supply power to the load, and the battery includes an electrochemical cell, and the power protection apparatus according to any one of the first aspect, the second aspect, or the implementations of the first aspect, where the power protection apparatus is configured to protect the electrochemical cell.

In the embodiments of the present application, charge overvoltage protection, discharge undervoltage protection, charge overcurrent protection, and discharge overcurrent protection of a battery are implemented by using the switching transistor group and the protection IC. A current imaging function of a detection field effect transistor is used to perform imaging on a current in the main through-current circuit based on a given proportional coefficient 1/K to obtain a very low current. The protection IC of the lithium-ion battery detects the very low current obtained through imaging, and then multiplies the very low current by a proportional coefficient K, to obtain a value of the current in the main through-current circuit. The sampling detection resistor Rs is serially connected between the sampling circuit detection output terminal and the output pin, and is not disposed on the charge and discharge circuit. In addition, a detection current passing through the sampling detection resistor Rs is 1/K of the current in the charge and discharge circuit, far less than the current in the charge and discharge circuit. Therefore, heat generated by the sampling detection resistor Rs is very small, and basically has no actual impact on temperature of the charge and discharge circuit.

In addition, a current passing through the sampling circuit detection terminal and the sampling detection resistor Rs is far less than a current passing through the main circuit of the switching transistor group and the charge and discharge circuit. Therefore, although a value of the sampling detection resistor Rs is scores of ohms to hundreds of ohms, no loss having actual impact is generated on the sampling detection resistor Rs. In addition, the resistance value of the sampling detection resistor Rs is not affected by a factor such as heating, and therefore a proper resistance value can be selected to achieve highest detection precision.

Finally, whether charge overcurrent or discharge overcurrent occurs is determined based on the detection current, and then the protection IC turns off a charge switch or a discharge switch to implement a function of charge overcurrent protection or discharge overcurrent protection. In this way, high-precision charge overcurrent protection and discharge overcurrent protection can be implemented without disposing a current sampling resistor on a charge and discharge through-current circuit of a terminal, thereby greatly reducing impedance of the through-current circuit and effectively reducing heat emitted by the charge and discharge circuit.

DESCRIPTION OF EMBODIMENTS

Figure 1:
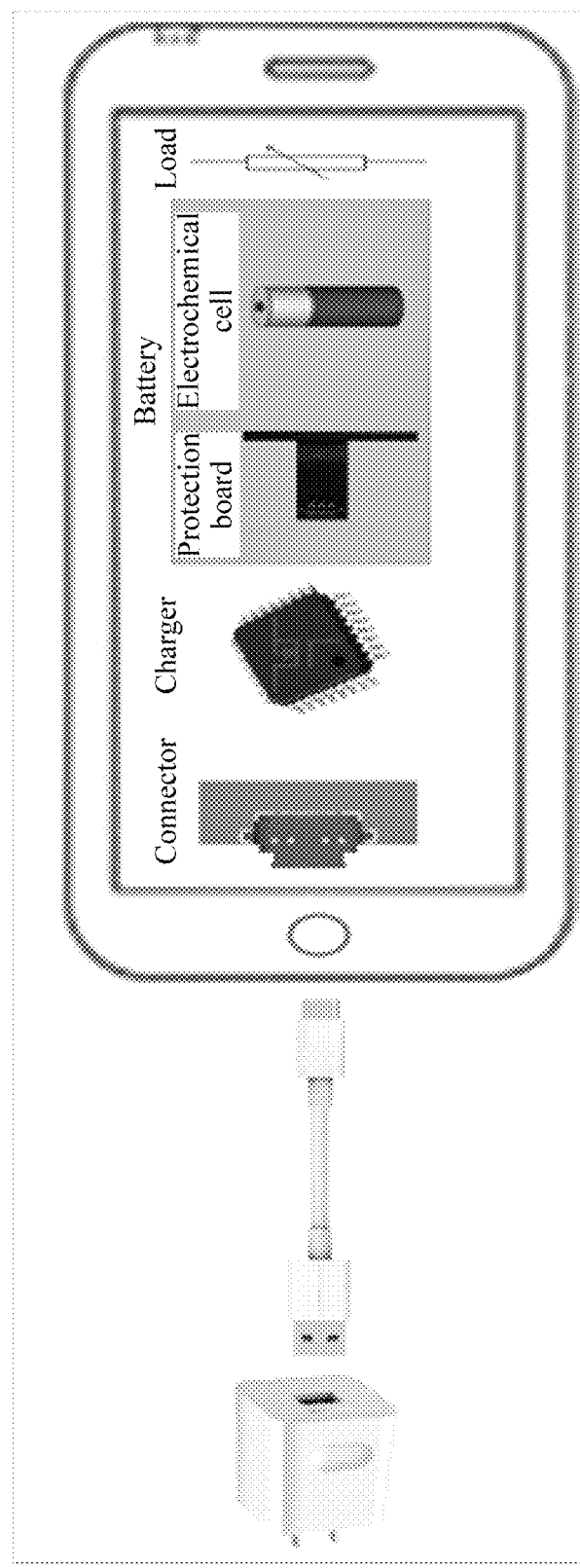
FIG. 1 is a diagram of an application scenario according to an embodiment of the present application.

The following clearly describes the technical solutions in the embodiments of the present application with reference to the accompanying drawings in the embodiments of the present application.

A power protection apparatus in the embodiments of the present application is mainly applicable to various electronic products having a rechargeable battery, and especially applicable to some portable devices, such as terminal products like mobile phones, tablet computers, notebook computers, and various wearable devices. This type of terminal that requires charging requires a power protection apparatus to implement power-off protection in cases such as overvoltage, overcurrent, and over-charge. Otherwise, an electrochemical cell in a battery is damaged, and even a serious consequence is caused, for example, the electrochemical cell is exploded. A battery in the embodiments of the present application includes a rechargeable-battery protection circuit or apparatus and an electrochemical cell. The electrochemical cell is an electric energy storage carrier, for example, a dry cell.

For ease of description, all electronic products having a rechargeable battery are referred to as terminals in the following.

The power protection apparatus in the embodiments of the present application may be used as a lithium-ion battery protection circuit of a consumer electronic device, for example, a lithium-ion battery protection circuit of a mobile phone, a wearable device like a watch, a notebook computer, a tablet computer, or the like. The lithium-ion battery protection circuit is located on an independent printed circuit board (PCB), and the PCB is connected to an electrochemical cell of a lithium-ion battery. A rechargeable battery in a consumer electronic product usually is a lithium-ion battery package including a PCB carrying a lithium-ion battery protection circuit, an electrochemical cell of a lithium-ion battery, and a housing, and is used to supply power to the consumer electronic device.

The power protection apparatus in the embodiments of the present application mainly includes an MOS transistor group and a protection integrated circuit (IC). The MOS transistor group and the protection integrated circuit are used together to implement charge overvoltage protection, discharge undervoltage protection, charge overcurrent protection, and discharge overcurrent protection of a battery. An advantage is that high-precision charge overcurrent protection and discharge overcurrent protection can be implemented without disposing a current sampling resistor on a charge and discharge through-current circuit of a terminal, thereby greatly reducing impedance of the through-current circuit and reducing heat. The power protection apparatus mainly performs, by using a current imaging function of a detection field effect transistor, imaging on a current in a main through-current circuit based on a given proportional coefficient 1/K to obtain a very low current. The protection IC of a lithium-ion battery detects the very low current obtained through imaging, then multiplies the very low current by a proportional coefficient K, to obtain a value of the current in the main through-current circuit, and finally determines, based on the value, whether charge overcurrent or discharge overcurrent occurs. Further, the protection IC turns off a charge switch or a discharge switch to implement a function of charge overcurrent protection or discharge overcurrent protection.

A current imaging principle of the detection field effect transistor used in the embodiments of the present application is: Small switching transistor units inside a switching transistor group are allocated on a same wafer based on a given ratio, for example, the switching transistor units are allocated based on a ratio of 1X/1000X, where 1000X switching transistor units in the ratio of 1:1000 are used for a through-current function of a main circuit, and 1X switching transistor units in the ratio of 1:1000 are used for current sampling. When voltages between output pins of the switching transistor units used for the through-current function of the main circuit and the switching transistor units used for current sampling are equal, because temperature features are consistent on the same wafer, an overall ratio of impedance of the switching transistor units used for the through-current function of the main circuit to impedance of the switching transistor units used for current sampling should also be 1:1000. In addition, because voltages at both ends of the switching transistor units used for the through-current function of the main circuit and the switching transistor units used for current sampling are also equal, a ratio of a current passing through the switching transistor units used for the through-current function of the main circuit to a current passing through the switching transistor units used for current sampling is 1000:1.

As shown in FIG. 1, a terminal using the power protection apparatus in an embodiment of the present application includes a connector connected to a charger by using a cable, a charge management chip, a power protection apparatus, an electrochemical cell of a battery, and a load. The power protection apparatus is a battery protection board. The load may be any electrically-driven component in the terminal, for example, a display, a communications module, a processor, a memory, a sensor, or a speaker.

During charge of the terminal, a current flow direction is: the charger→the cable→the connector→the charge management chip→the power protection apparatus→the electrochemical cell. During discharge, a current flow direction is: the electrochemical cell→the protection board→the load.

In a charge process of the terminal, charge currents of the charger, the charge management chip, and the protection board are limited. When the charger, or the charge management chip, or both fail, charge overcurrent protection of the electrochemical cell is implemented by the protection board. When charge overcurrent is detected, a switch component on the protection board is disconnected to cut off a charge path.

In a discharge process, a discharge current of the protection board is limited. When the load is abnormal, for example, the load is short-circuited, discharge overcurrent protection of the lithium-ion battery is implemented by the protection board. When discharge overcurrent is detected, a switch component on the protection board is disconnected to cut off a discharge path.

Embodiment 1

Figure 2:
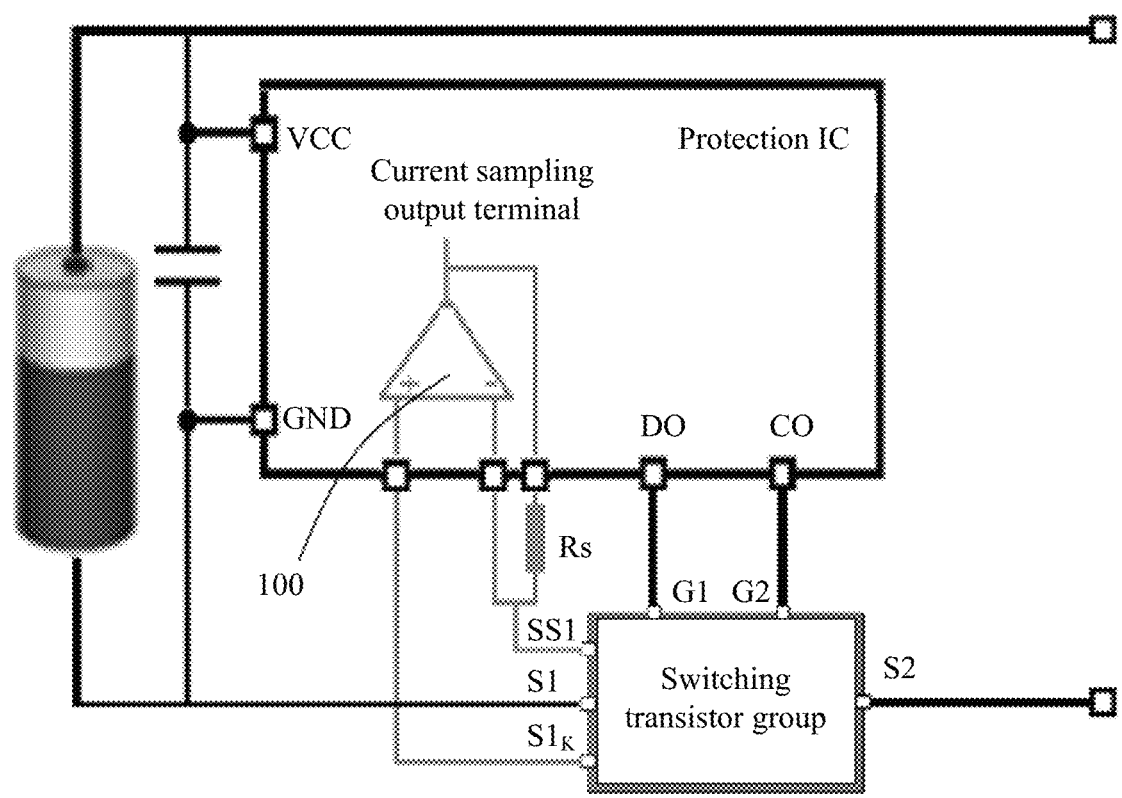
FIG. 2 is a circuit diagram of a power protection apparatus according to Embodiment 1 of the present application.
Figure 3:
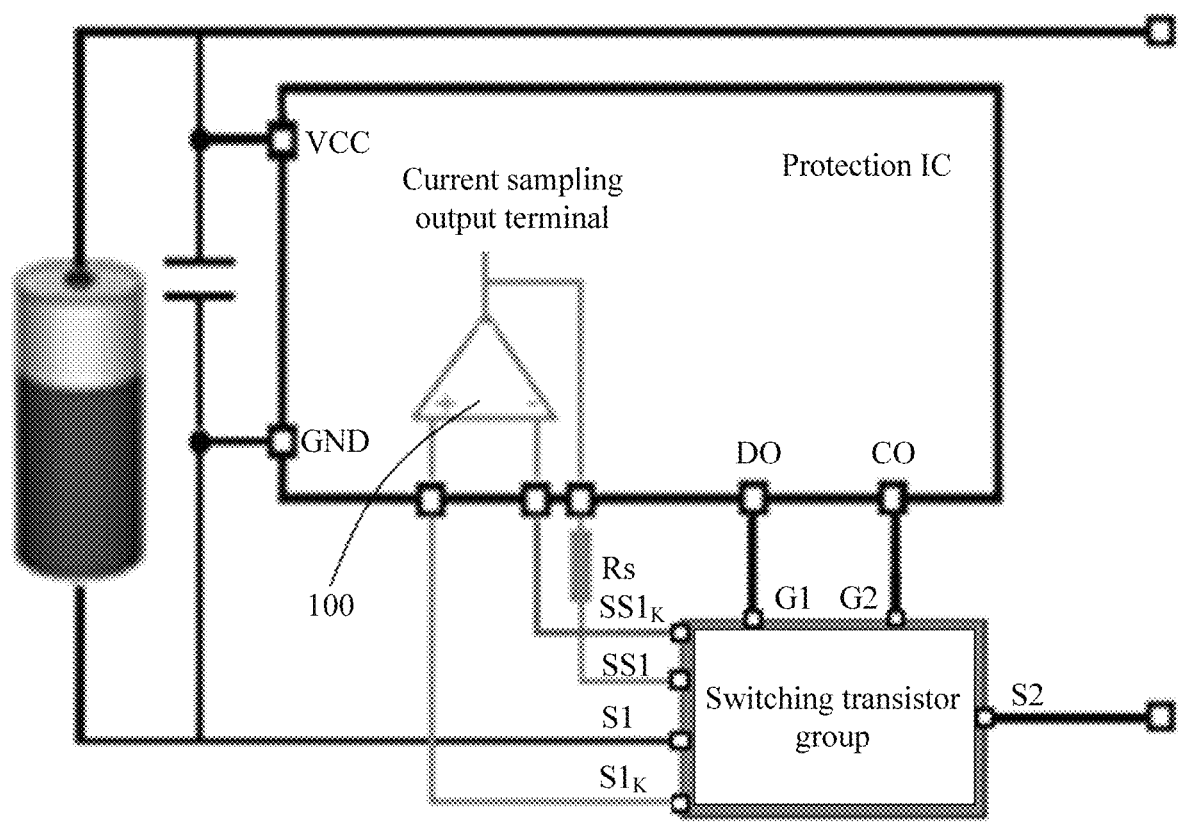
FIG. 3 is another circuit diagram of a power protection apparatus according to Embodiment 1 of the present application.

Referring to FIG. 2 and FIG. 3, a terminal having a charge protection function includes an electrochemical cell, a power protection apparatus, and a load that is powered by using the electrochemical cell. The power protection apparatus mainly includes a protection IC connected to the electrochemical cell, and a switching transistor group configured to turn on and turn off the electrochemical cell for protection.

The protection IC includes a power terminal VCC connected to a positive electrode of the electrochemical cell, a ground terminal GND connected to a negative electrode of the electrochemical cell, a positive current detection terminal, a negative current detection terminal, a current sampling detection output terminal, a discharge protection terminal DO, and a charge protection terminal CO. The power terminal VCC and the ground terminal GND are two power input terminals of the protection IC. The IC protection circuit includes an operational amplifier 100. The operational amplifier 100 includes a positive input pin connected to the positive current detection terminal, a negative input pin connected to the negative current detection terminal, and an output pin connected to the current sampling detection output terminal. The positive and negative electrodes of the electrochemical cell may be further connected to a filter capacitor, configured to filter an interference current and an interference voltage.

The switching transistor group is serially connected between the negative electrode of the electrochemical cell and the load, and includes a first connection terminal $S_1$ connected to the negative electrode of the electrochemical cell and a second connection terminal $S_2$ connected to the load. The switching transistor group further includes a discharge control terminal G1 configured to control turn-off of the switching transistor group during discharge, and a charge control terminal G2 configured to control turn-off of the switching transistor group during charge. The discharge control terminal G1 is correspondingly connected to the discharge protection terminal DO of the protection IC, and the charge control terminal G2 is correspondingly connected to the charge protection terminal CO of the protection IC.

The switching transistor group further includes a sampling circuit constituted by connecting X switching transistor units of a sampling part in parallel, and a main circuit constituted by connecting KX switching transistor units of a main circuit part in parallel, where X is an integer greater than or equal to 1, and K is a value greater than 1. Theoretically, to gain a relatively ideal effect, X needs to be set to a proper value. For example, if X is an integer greater than or equal to 1, for example, a value in [1, 10000], a value of X may be set to 100, 1000, 3000, 5000, or the like, and K is greater than or equal to 100, for example, K may be set to a value greater than 1, for example, 100, 500, 1000, 5000, or 10000. Theoretically, a larger value of K indicates higher accuracy, and KX is an integer. Specifically, comparison tests may be repeatedly performed based on a process, costs, and crystal or transistor characteristics to ensure that through-current impedance of the power protection apparatus is small enough and overcurrent protection precision is high enough. Equivalently, the first connection terminal $S_1$ and the second connection terminal $S_2$ are respectively connected to a charge-specific input terminal and output terminal of the main circuit part of the switching transistor group, or to a discharge-specific output terminal and input terminal of the main circuit part of the switching transistor group. In other words, the main circuit part of the switching transistor group is a part of a charge and discharge circuit of the electrochemical cell. A current in the charge and discharge circuit passes through the main circuit mainly through the first connection terminal $S_1$ and the second connection terminal $S_2$.

The switching transistor group further includes a sampling circuit detection terminal connected to a connection terminal of the sampling circuit, and a main circuit detection terminal connected to an input or output terminal of the main circuit. The main circuit detection terminal is connected to the positive input pin, and the sampling circuit detection terminal is connected to the negative input pin.

In one embodiment, the sampling circuit detection terminal includes a sampling circuit output terminal $SS_1$, and the main circuit detection terminal includes a detection output terminal $S_{1k}$ connected to the main circuit. The sampling circuit output terminal $SS_1$ is connected to the negative input pin of the operational amplifier 100 by using the negative current detection terminal of the protection IC. The main circuit detection output terminal $S_{1k}$ is connected to the positive input pin of the operational amplifier 100 by using the positive current detection terminal of the protection IC.

The sampling circuit output terminal $SS_1$ is further connected to the output pin of the operational amplifier 100, and the output pin is connected to the current sampling detection output terminal of the protection IC. The power protection apparatus further includes a sampling detection resistor Rs. The sampling detection resistor Rs is serially connected between the sampling circuit output terminal $SS_1$ and the output pin of the operational amplifier 100, and is configured to generate a sampling detection current. The electrochemical cell, the switching transistor group, and the load constitute the charge and discharge circuit that is a main conductivity circuit for discharge or charge of the electrochemical cell.

Specially, referring to FIG. 3, in some embodiments, to improve precision, the sampling circuit detection terminal further includes a sampling detection output terminal $SS_{1k}$ connected to the sampling circuit. The sampling circuit output terminal $SS_1$ is connected to only the output pin of the operational amplifier 100. The sampling detection output terminal $SS_{1k}$ is connected to the negative input pin of the operational amplifier 100, and the sampling detection resistor Rs is serially connected between the sampling circuit output terminal $SS_1$ and the output pin of the operational amplifier 100.

Figure 4:
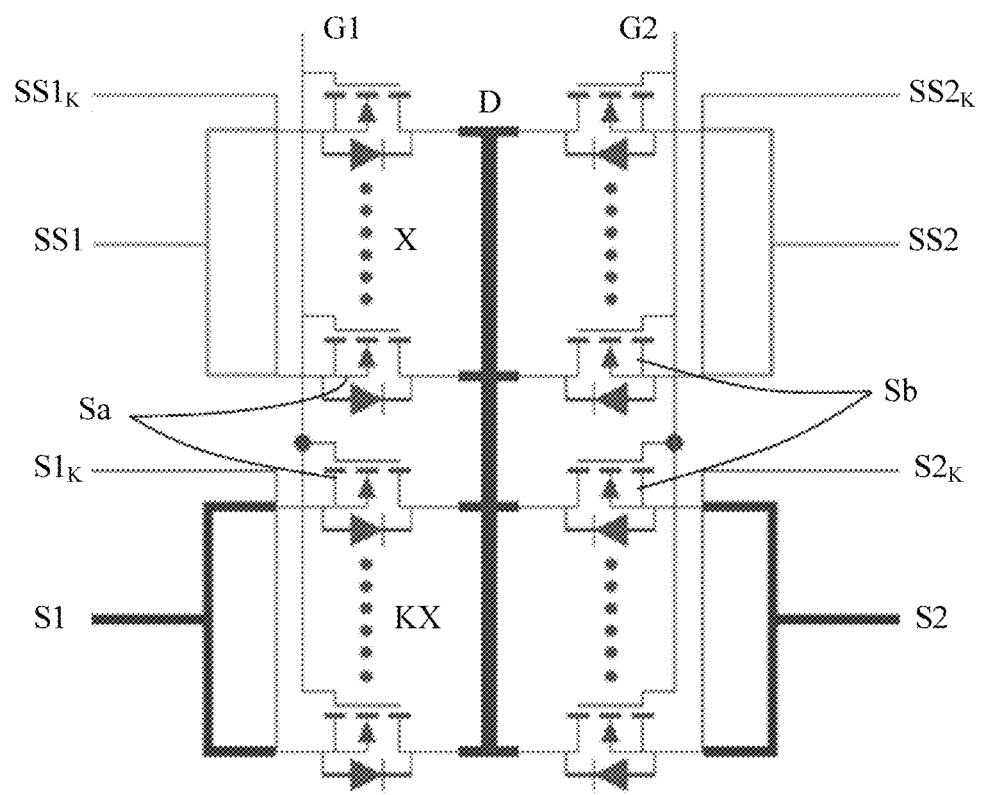
FIG. 4 is a schematic structural diagram of a switching transistor group according to an embodiment of the present application.

As shown in FIG. 4, the switching transistor group includes (X+KX) switching transistor units that are connected in parallel, where X MOS switching transistor units are connected in parallel to constitute the sampling circuit, KX MOS transistors are connected in parallel to constitute the main circuit, each switching transistor unit includes a first switching transistor Sa and a second switching transistor Sb that is serially connected to the Sa reversely, each Sa or SB is connected to a diode D1 in parallel, and one of the Sa and the Sb is a charge switching transistor and the other one is a discharge switching transistor. In this embodiment, for ease of description, the Sa is selected as the discharge switching transistor, and is turned on when the electrochemical cell is discharged and turned off when the electrochemical cell is charged; and the Sb is the charge switching transistor, and is turned on when the electrochemical cell is charged and turned off when the electrochemical cell is discharged. The D1 is configured to protect the Sa and the Sb, to prevent them from being broken down. The Sa and the Sb may be MOS transistors, or may be other semiconductor switching transistors having a similar characteristic.

The X switching transistor units are connected in parallel to constitute the sampling circuit, and the KX switching transistor units are connected in parallel to constitute the main circuit. D electrodes of Sa's and Sb's of the (X+KX) switching transistor units are connected together, G electrodes of the Sa's of the (X+KX) switching transistor units are connected together to constitute the discharge control terminal G1, and G electrodes of the Sb's of the (X+KX) switching transistor units are connected together to constitute the charge control terminal G2.

S electrodes of all Sa's of the X switching transistor units constituting the sampling circuit are connected to a same pin to constitute the sampling circuit output terminal $SS_1$. S electrodes of all Sb's of the X switching transistor units are connected to a same pin to constitute the sampling circuit output terminal $SS_2$.

Similar to the sampling circuit, S electrodes of all Sa's of the KX switching transistor units constituting the main circuit are connected to a same pin to constitute the first connection terminal $S_1$ of the switching transistor group, and S electrodes of all Sb's of the X switching transistor units are connected to a same pin to constitute the second connection terminal $S_2$ of the switching transistor group. To reduce impact of impedance of the pin itself and improve detection precision, the sampling detection output terminal $SS_{1k}$ of the switching transistor group may be constituted by directly connecting the S electrodes on wafers of all the Sa's of the X switching transistor units of the sampling circuit by using a high-conductivity metal wire. Similarly, another sampling detection output terminal $SS_{2k}$ of the switching transistor group may be constituted by directly connecting the S electrodes on wafers of all the Sb's of the X switching transistor units of the sampling circuit by using a high-conductivity metal.

Similar to the sampling circuit, the detection output terminal $S_{1k}$ of the main circuit may be constituted by directly connecting the S electrodes on wafers of all the Sa's of the KX switching transistor units of the main circuit by using a high-conductivity metal wire. Similarly, another detection output terminal $S_{2k}$ of the main circuit of the switching transistor group may be constituted by directly connecting the S electrodes on wafers of all the Sb's of the KX switching transistor units of the main circuit by using a high-conductivity metal.

The high-conductivity metal wire includes a high-conductivity gold wire, a high-conductivity silver wire, a high-conductivity copper wire, and the like, or may include some high-conductivity alloy conductors. A current does not need to pass through a pin, but is directly output from a wafer of the switching transistor group by using a high-conductivity metal wire, so that current detection precision is not affected by impedance of the pin itself.

It can be understood that in some embodiments, when a detection precision requirement is not extremely high or detection precision can satisfy a need currently, the sampling detection output terminals $SS_{1k}$ and $SS_{2k}$, and the main circuit detection output terminals $S_{1k}$ and $S_{2k}$ do not need to be led out of wafers of the transistors of the switching transistor group by using the high-conductivity metal wire, but various output terminals $SS_1$, $SS_2$, $S_1$, and $S_2$ constituted by pins of the switching transistor group are directly used. In addition, in some embodiments, the main circuit detection terminal may be the first connection terminal $S_1$ connected to each Sa of the main circuit of the switching transistor group, and the second connection terminal Sb connected to each Sb of the main circuit of the switching transistor group.

In some embodiments, positions of the Sa and the Sb are interchangeable; and the operational amplifier 100 may alternatively be connected to the other side of the switching transistor group, that is, the operational amplifier 100 may be connected to the $SS_2$, the $SS_{2k}$, and the $S_{2k}$. Such a different connection manner does not cause changes to implementation principles and manners, and details are not described herein.

Figure 5:
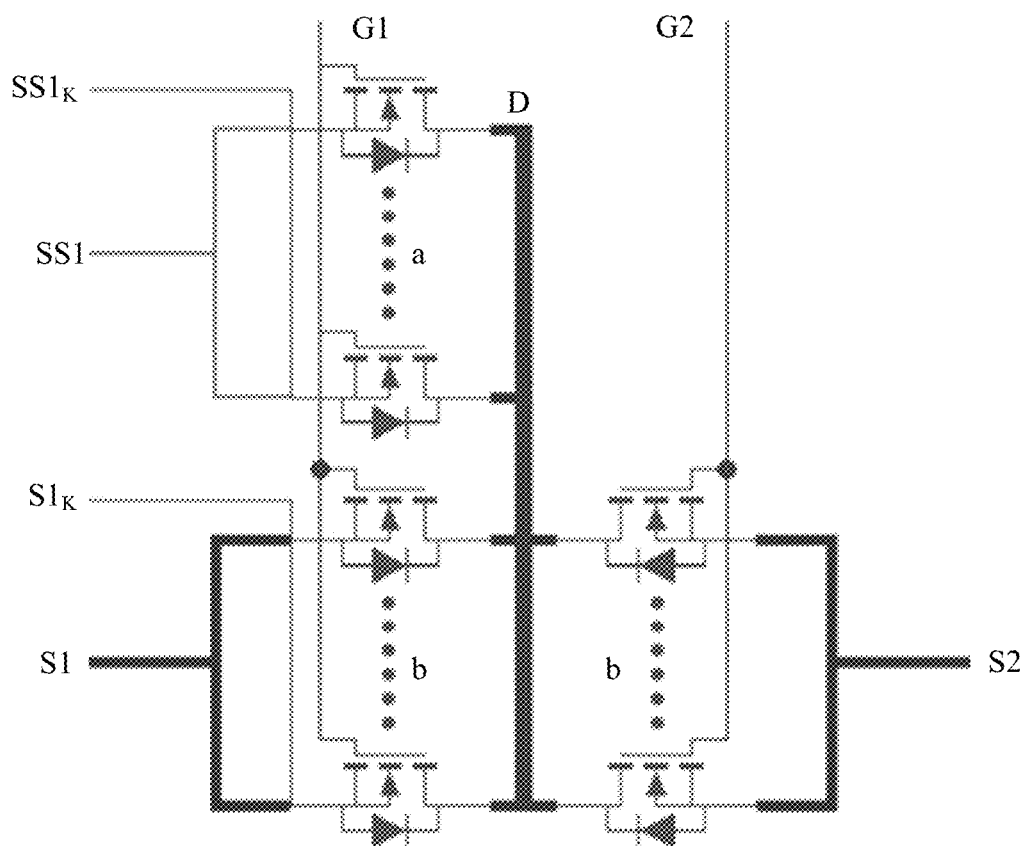
FIG. 5 is a schematic structural diagram of another switching transistor group according to an embodiment of the present application.
Figure 6:
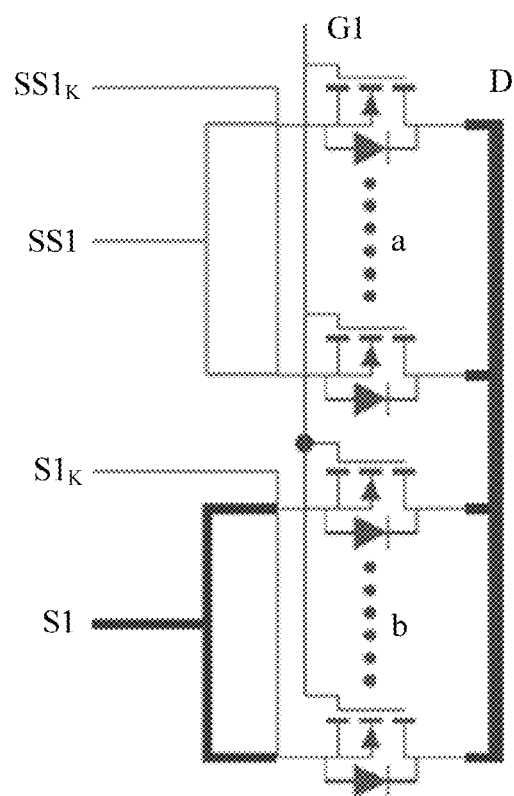
FIG. 6 is a schematic structural diagram of still another switching transistor group according to an embodiment of the present application.

In some embodiments of the present application, the switching transistor group is not limited to that each switching transistor unit includes both the Sa and the Sb, as shown in FIG. 4. As shown in FIG. 5, the switching transistor group is a unidirectional switching transistor group, and each switching transistor unit includes only one switching transistor to protect only charge or discharge of the electrochemical cell. Alternatively, as shown in FIG. 6, in some embodiments of the present application, the switching transistor group is a bi-directional switching transistor group, but only each switching transistor unit of the main circuit part of the switching transistor group includes two switching transistors that are serially connected reversely, and each switching transistor unit of the sampling circuit part of the switching transistor group includes only one switching transistor. Therefore, the switching transistor group in this embodiment of the present application is not limited to a specific structure design, and any switching transistor group that can implement an equal-proportion current imaging relationship when a voltage of the main circuit and a voltage of the sampling circuit are equal can be used as the switching transistor group in this embodiment of the present application.

The operational amplifier 100 is configured to adjust the negative input pin and the positive input pin to obtain a same potential, that is, enable the sampling detection output terminal $SS_{1k}$ of the switching transistor group and the detection output terminal $S_{1k}$ of the main circuit to have a same potential. Various MOS transistor units constituting the switching transistor group are on a same wafer, the units are highly consistent, and temperature characteristics and impedance of the units are also consistent. Therefore, a voltage between the discharge control terminal G1 and the sampling detection output terminal $SS_{1k}$ of the switching transistor group is equal to a voltage between the discharge control terminal G1 and the detection output terminal $S_{1k}$ of the main circuit, and a voltage between a D electrode of a switching transistor of the sampling circuit and the $SS_{1k}$ is equal to a voltage between a D electrode of a switching transistor of the main circuit and the $S_{1k}$, that is, $V_{G1SS1k}=V_{G1S1K}$ and $V_{DSS1k}=V_{DS1K}$. A relationship between a resistance $R_{DSS1k}$ between the D electrode of the switching transistor of the sampling circuit and the sampling detection output terminal $SS_{1k}$ and a resistance $R_{DS1k}$ between the D electrode of the switching transistor of the main circuit and the main circuit output terminal $S_{1k}$ is $R_{DSS1k}:R_{DS1k}=K:1$. In other words, a ratio of impedance of the main circuit of the switching transistor group to impedance of the sampling circuit of the switching transistor group is equal to an inverse ratio of a quantity of parallel-connected MOS transistor units of the main circuit to a quantity of parallel-connected MOS transistor units of the sampling circuit, that is, 1/k.

When $V_{G1SS1k}=V_{G1S1K}$, $R_{DSS1k}:R_{DS1k}$ is equal to K:1, a current of the sampling detection output terminal $SS_{1k}$ is $I_{SS1k}$, and a current of the main circuit output terminal $S_{1k}$ is $I_{S1k}$. In this case, $I_{SS1k}:I_{S1k}=1/1/(R_{DSS1k}:R_{DS1k})=1:K$, or in other words, the current $I_{SS1k}$ of the sampling circuit is an image current that is obtained by reducing the main circuit current $I_{S1k}$ by K times. Therefore, after the current $I_{SS1k}$ of the sampling circuit is detected, $I_{S1k}$ may be obtained based on an imaging ratio coefficient K, that is, $I_{S1k}=K*I_{SS1k}$.

When K is large enough, for example, K is greater than or equal to 100, 1000, or 10000, $I_{S1k}$ is basically equal to a current $I_{S1}$ passing through the switching transistor group and the entire charge and discharge circuit, and $I_{SS1k}$ is basically equal to a sampling circuit current passing through $I_{SS1}$. Therefore, $I_{SS1}/I_{S1}=1/K$. The protection IC determines, based on a value of $S_{1k}$, whether to send a turn-off signal to the discharge control terminal G1 and the charge control terminal G2 of the switching transistor group, to turn off the switching transistor group to stop charging or discharging the electrochemical cell.

Imaging principles of connection terminals led out of the Sb, for example, the $S_2$, the $S_{2k}$, and $SS_{2k}$, and the $S_1$, the $S_{1k}$, and the $SS_{1k}$, are the same.

When $V_{G2SS2k}=V_{G2S2K}$, $R_{DSS2k}:R_{DS2k}$ is equal to K:1, a current of the sampling detection output terminal $SS_{2k}$ is $I_{SS2k}$, and a current of the main circuit output terminal $S_{2k}$ is $I_{S2k}$. In this case, $I_{SS2k}:I_{S2k}=1/1/(R_{DSS2k}:R_{DS2k})=1:K$, or in other words, the current $I_{SS2k}$ of the sampling circuit is an image current that is obtained by reducing the main circuit current $I_{S2k}$ by K times. Therefore, after the current $I_{SS1k}$ of the sampling circuit is detected, $I_{S1k}$ may be obtained based on an imaging ratio coefficient K, that is, $I_{S2k}=K*I_{SS2k}$.

It can be understood that characteristics and working principles of the Sa and the Sb of the switching transistor group are exactly consistent, except that conductivity directions are inverse. For brevity, only key points are simply described herein, and specific implementation details are not provided.

In one embodiment of the present application, charge overvoltage protection, discharge undervoltage protection, charge overcurrent protection, and discharge overcurrent protection of a battery are implemented by using the switching transistor group and the protection IC. A current imaging function of a detection field effect transistor is used to perform imaging on the current in the main through-current circuit based on a given proportional coefficient 1/K to obtain a very low current. The protection IC of the lithium-ion battery detects the very low current obtained through imaging, and then multiplies the very low current by a proportional coefficient K, to obtain a value of the current in the main through-current circuit. The sampling detection resistor Rs is serially connected between the sampling detection output terminal $SS_{1k}$ and the output pin, and is not disposed on the charge and discharge circuit. In addition, a detection current passing through the sampling detection resistor Rs is 1/K of the current in the charge and discharge circuit, far less than the current in the charge and discharge circuit. Therefore, heat generated by the sampling detection resistor Rs is very small, and basically has no actual impact on temperature of the charge and discharge circuit.

In addition, a current passing through the sampling detection output terminal $SS_{1k}$ and the sampling detection resistor Rs is far less than a current passing through the main circuit of the switching transistor group and the charge and discharge circuit. Therefore, although a value of the sampling detection resistor Rs is scores of ohms to hundreds of ohms, no loss having actual impact is generated on the sampling detection resistor Rs. In addition, the resistance value of the sampling detection resistor Rs is not affected by a factor such as heating, and therefore a proper resistance value can be selected to achieve highest detection precision.

Finally, whether charge overcurrent or discharge overcurrent occurs is determined based on the detection current, and then the protection IC turns off a charge switch or a discharge switch to implement a function of charge overcurrent protection or discharge overcurrent protection. In this way, high-precision charge overcurrent protection and discharge overcurrent protection can be implemented without disposing a current sampling resistor on a charge and discharge through-current circuit of a terminal, thereby greatly reducing impedance of the through-current circuit and effectively reducing heat emitted by the charge and discharge circuit.

In addition, based on the foregoing imaging detection current and the proper value of the sampling detection resistor Rs, precision of a reference voltage of a comparator, configured to determine overcurrent, of the power protection apparatus can reach X mV±2 mV, for example, 200 mV±2 mV. An error caused by the precision of the reference voltage of the comparator, configured to determine overcurrent, of the power protection apparatus is only 1%. For another example, an overcurrent protection design of implementing turn-off within 3.5 seconds (S) when a current reaches a threshold of 7±0.7 amperes (A) can satisfy a requirement that protection is enabled within 5 s when a current is 8 A and turn-off protection is not enabled within 60 s when a current is 5 A, within 5 s when a current is 6 A, or within 2 s when a current is 7 A. For 7 A, 0.7 A is precision of 10%. An error caused by precision of the protection IC in the error of 10% may be within 1%. An error caused by precision of the current sampling resistor may be within 1%, and an error caused by current imaging ratio precision of the MOS transistor group may be within 5%. In this way, an accumulated error is less than 10%.

When a voltage of a second terminal of the sampling detection resistor Rs, or in other words, an amplitude of a detected signal, is greater than the reference voltage of the comparator that is configured to determine overcurrent and that is of the protection IC, an output terminal of the comparator outputs a first level, to turn off the switching transistor group, which indicates that overcurrent occurs on the charge and discharge circuit and the switching transistor group; otherwise, a second level is output to keep conductivity of the switching transistor group, which indicates that no overcurrent occurs on the charge and discharge circuit or the switching transistor group.

In some embodiments, the power protection apparatus may be configured to protect a power supply or a component other than the electrochemical cell against a current or voltage abnormality. When a detection current of the power supply or the component is abnormal, for example, too high or too low, a protection measure such as turn-off, voltage reduction, or voltage increase is implemented.

Embodiment 2

Figure 7:
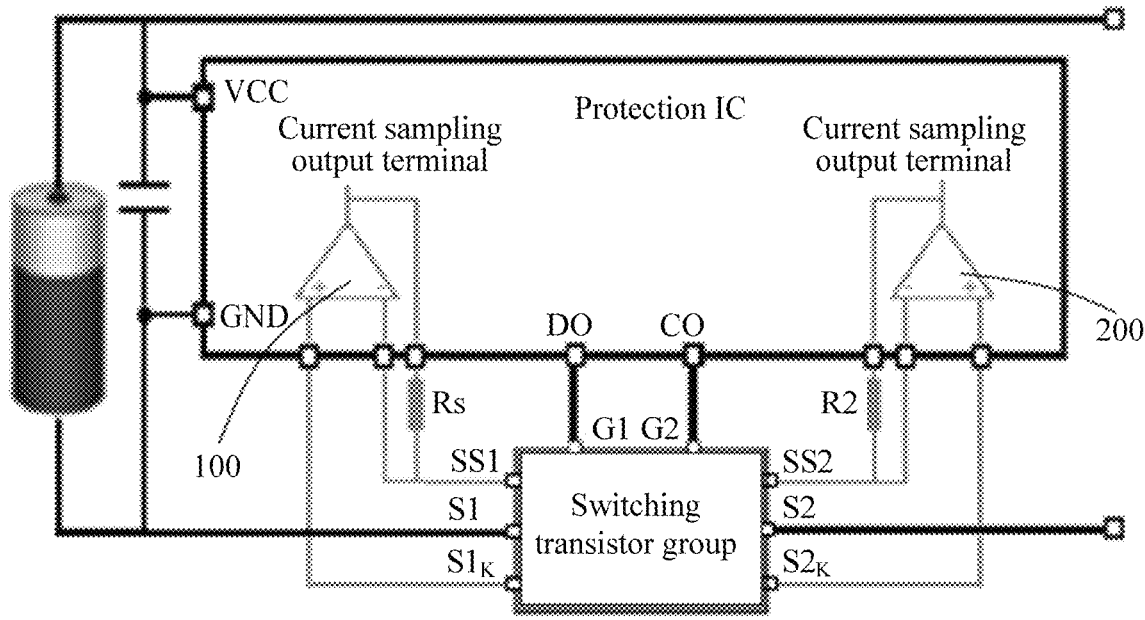
FIG. 7 is a circuit diagram of a power protection apparatus according to Embodiment 2 of the present application.

As shown in FIG. 7, a difference between a power protection apparatus in Embodiment 2 of the present application and the power protection apparatus in Embodiment 1 of the present application lies in: the power protection apparatus in Embodiment 1 has only one operational amplifier 100, and the operational amplifier 100 is connected to only an output terminal of a discharge switching transistor Sa of the switching transistor group; and in Embodiment 2, a secondary operational amplifier 200 is further included based on Embodiment 1, and the secondary operational amplifier 200 is connected to an output terminal of a charge switching transistor Sb of the switching transistor group. Specific details are as follows:

Based on Embodiment 1, the protection IC further includes a positive current detection terminal, a negative current detection terminal, and a current sampling detection output terminal.

The secondary operational amplifier 200 further includes a positive input pin connected to the positive current detection terminal, a negative input pin connected to the negative current detection terminal, and an output pin connected to the current sampling detection output terminal.

A sampling circuit output terminal $SS_2$ of the switching transistor group is connected to the negative input pin of the secondary operational amplifier 200 by using the negative current detection terminal of the protection IC, and a detection output terminal $S_{2k}$ of the main circuit is connected to the positive input pin of the secondary operational amplifier 200 by using the positive current detection terminal of the protection IC.

The sampling circuit output terminal $SS_2$ is connected to the output pin of the secondary operational amplifier 200, and the output pin is connected to the current sampling detection output terminal of the protection IC. The power protection apparatus further includes a sampling detection resistor Rs. The sampling detection resistor Rs is serially connected between the sampling circuit output terminal $SS_2$ of the switching transistor group and the output pin of the secondary operational amplifier 200, and is configured to generate a sampling detection current.

The secondary operational amplifier 200 in Embodiment 2 of the present application is similar to the operational amplifier 100 in Embodiment 1 in connection, and a tiny difference has been described above. Principles of current detection and overcurrent protection of a charge and discharge circuit in Embodiment 2 of the present application are completely the same as those in Embodiment 1, and details are not described herein again.

Figure 8:
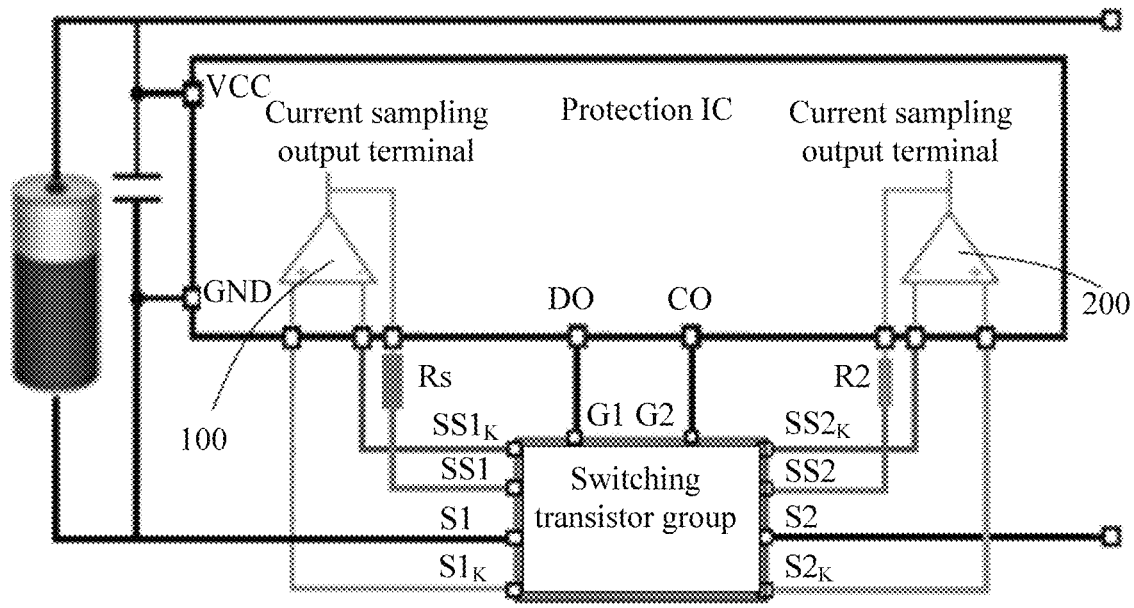
FIG. 8 is another circuit diagram of a power protection apparatus according to Embodiment 2 of the present application.

As shown in FIG. 8, in some embodiments of the present application, to improve precision, the sampling circuit output terminal $SS_2$ is connected to only the output pin of the secondary operational amplifier 200, the sampling detection output terminal $SS_{2k}$ is connected to the negative input pin of the secondary operational amplifier 200, and the sampling detection resistor Rs is serially connected between the sampling circuit output terminal $SS_2$ and the output pin of the secondary operational amplifier 200.

It can be understood that in some embodiments, the protection IC only has one secondary operational amplifier 200 that is connected to an output terminal of the charge switching transistor Sb of the switching transistor group. This can also implement the present application. An image current is used as a sampling detection current to detect charge and discharge current values of the electrochemical cell, and turn-off of the switching transistor group is controlled based on the charge and discharge current values obtained through sampling detection and a comparison result of the comparator, to implement protection against abnormalities such as overcurrent and overheat of the electrochemical cell.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

The foregoing descriptions are merely specific implementations of the present application, but are not intended to limit the protection scope of the present application. Any variation or replacement readily figured out by a person skilled in the art within the technical scope disclosed in the present application shall fall within the protection scope of the present application. Therefore, the protection scope of the present application shall be subject to the protection scope of the claims.

What is claimed is:

1. A power protection apparatus configured to protect an electrochemical cell connected to a load, comprising:
   a protection integrated circuit (IC), comprising two power input terminals respectively connected to positive and negative electrodes of the electrochemical cell, at least one charge and discharge protection terminal, and an operational amplifier, wherein the operational amplifier comprises a positive input pin, a negative input pin, and an output pin;
   a switching transistor group, connected between the negative electrode of the electrochemical cell and the load, and configured to turn on or turn off a charge and discharge of the electrochemical cell, wherein the switching transistor group comprises a main circuit part and a sampling part, a first connection terminal connected to the negative electrode of the electrochemical cell, a second connection terminal connected to the load, and at least one control terminal, wherein the first connection terminal and the second connection terminal are respectively connected to an input terminal and an output terminal of the main circuit part, and the control terminal is connected to the at least one charge and discharge protection terminal of the protection IC, and is configured to receive a control signal of the protection IC to control turn-off of the switching transistor group to implement protection against an abnormality of the electrochemical cell; and
   a sampling detection resistor Rs, serially connected between the sampling part of the switching transistor group and the output pin, and configured to detect a current of the sampling part of the switching transistor group, wherein
   the input terminal or the output terminal of the main circuit part of the switching transistor group is connected to the positive input pin, and a connection terminal of the sampling part of the switching transistor group is connected to the negative input pin, wherein the switching transistor group comprises (X+KX) switching transistor units that are connected in parallel; X switching transistor units are connected in parallel to form the sampling part of the switching transistor group; KX switching transistor units are connected in parallel to form the main circuit part, wherein X is an integer greater than 1, K is greater than 1, and KX is an integer.

2. The power protection apparatus according to claim 1, wherein the operational amplifier is configured to enable the negative input pin and the positive input pin to have a same potential, so that a current passing through the sampling part of the switching transistor group is equally proportional to a current passing through the main circuit part of the switching transistor group.

3. The power protection apparatus according to claim 1, wherein a ratio of the current passing through the sampling part to the current passing through the main circuit part is equal to a ratio of a quantity of switching transistor units of the sampling part to a quantity of switching transistor units of the main circuit part, that is, is equal to 1:K.

4. The power protection apparatus according to claim 3, wherein the switching transistor group comprises a sampling output terminal $SS_1$ connected to the connection terminal of the sampling part, and a main circuit detection output terminal $S_{1k}$ connected to the input terminal of the main circuit part of the switching transistor group, the $S_{1k}$ is connected to the positive input pin of the operational amplifier, the $SS_1$ is connected to both the negative input pin and the output pin of the operational amplifier, and the sampling detection resistor Rs is serially connected between the $SS_1$ and the output pin of the operational amplifier.

5. The power protection apparatus according to claim 4, wherein the switching transistor group further comprises a sampling output terminal $SS_2$ connected to the connection terminal of the sampling part, and a main circuit detection output terminal $S_{2k}$ connected to the output terminal of the main circuit part, the protection IC further comprises a secondary operational amplifier, the $S_{2k}$ is connected to a positive input pin of the secondary operational amplifier, the $SS_2$ is connected to both a negative input pin and an output pin of the secondary operational amplifier, and the power protection apparatus further comprises a sampling detection resistor R2 that is serially connected between the $SS_2$ and the output pin of the secondary operational amplifier.

6. The power protection apparatus according to claim 3, wherein the switching transistor group comprises a sampling output terminal $SS_1$ and a sampling detection output terminal $SS_{1k}$ that are connected to the connection terminal of the sampling part, and a main circuit detection output terminal $S_{1k}$ connected to the input terminal of the main circuit part, the $S_{1k}$ is connected to the positive input pin of the operational amplifier, the $SS_1$ is connected to the output pin of the operational amplifier, the $SS_{1k}$ is connected to the negative input pin of the operational amplifier, and the sampling detection resistor Rs is serially connected between the $SS_1$ and the output pin of the operational amplifier.

7. The power protection apparatus according to claim 6, wherein the switching transistor group further comprises a sampling output terminal $SS_2$ and a sampling detection output terminal $SS_{2k}$ that are connected to the connection terminal of the sampling part, and a main circuit detection output terminal $S_{2k}$ connected to the output terminal of the main circuit part of the switching transistor group, the protection IC further comprises a secondary operational amplifier, the $S_{2k}$ is connected to a positive input pin of the secondary operational amplifier, the $SS_2$ is connected to an output pin of the secondary operational amplifier, the $SS_{2k}$ is connected to a negative input pin of the secondary operational amplifier, and the power protection apparatus further comprises a sampling detection resistor R2 that is serially connected between the $SS_2$ and the output pin of the secondary operational amplifier.

8. The power protection apparatus according to claim 6, wherein each switching transistor unit comprises a first switching transistor Sa and a second switching transistor Sb that is serially connected to the Sa reversely, each of the Sa and Sb is connected to a diode D1 in parallel, one of the Sa and the Sb is a charge switching transistor and the other is a discharge switching transistor, the X switching transistor units are connected in parallel to form the sampling part of the switching transistor group, and the KX switching transistor units are connected in parallel to form the main circuit part of the switching transistor group.

9. The power protection apparatus according to claim 8, wherein the at least one control terminal comprises a discharge control terminal G1 and a charge control terminal G2, D electrodes of all Sa's and Sb's of the (X+KX) switching transistor units are connected together, G electrodes of all Sa's of the (X+KX) switching transistor units are connected together to form the G1, G electrodes of all Sb's of the (X+KX) switching transistor units are connected together to form the G2, S electrodes of all Sa's of the X switching transistor units constituting the sampling part of the switching transistor group are connected to a same pin to form the sampling output terminal $SS_1$, S electrodes of all Sb's of the X switching transistor units are connected to a same pin to form a sampling output terminal $SS_2$, S electrodes of all Sa's of the KX switching transistor units constituting the main circuit part of the switching transistor group are connected to a same pin to form the first connection terminal of the switching transistor group, and S electrodes of all Sb's of the X switching transistor units are connected to a same pin to form the second connection terminal of the switching transistor group.

10. The power protection apparatus according to claim 9, wherein the sampling detection output terminal $SS_{1k}$ is formed by directly connecting the S electrodes on wafers of all the Sa's of the X switching transistor units of the sampling part of the switching transistor group by using a high-conductivity metal wire, a sampling detection output terminal $SS_{2k}$ is formed by directly connecting the S electrodes on wafers of all the Sb's of the X switching transistor units of the sampling part of the switching transistor group by using a high-conductivity metal, the main circuit detection output terminal $S_{1k}$ is formed by directly connecting the S electrodes on wafers of all the Sa's of the KX switching transistor units of the main circuit part of the switching transistor group by using a high-conductivity metal wire, and a main circuit detection output terminal $S_{2k}$ is formed by directly connecting the S electrodes on wafers of all the Sb's of the KX switching transistor units of the main circuit part of the switching transistor group by using a high-conductivity metal.

11. The power protection apparatus according to claim 1, wherein the at least one control terminal comprises a discharge control terminal G1 configured to control turn-off of the switching transistor group during discharge, and a charge control terminal G2 configured to control turn-off of the switching transistor group during charge, and the at least one charge and discharge protection terminal of the protection IC comprises a discharge protection terminal DO connected to the discharge control terminal G1, and a charge protection terminal CO connected to the charge control terminal G2.

12. A terminal, comprising a connector, a charge management chip, a battery, and a load, wherein the connector is configured to connect to a charge cable, the charge management chip is connected between the connector and the battery and is configured to control a charge process of the battery, the battery is configured to supply power to the load, and the battery comprises an electrochemical cell and the power protection apparatus according to claim 1, wherein the power protection apparatus is configured to protect the electrochemical cell.

13. A power protection apparatus configured to protect an electrochemical cell connected to a load, comprising:
a protection integrated circuit (IC), comprising two power input terminals respectively connected to positive and negative electrodes of the electrochemical cell, a positive current detection terminal, a negative current detection terminal, a current sampling detection output terminal, and at least one charge and discharge protection terminal;

a switching transistor group, connected between the negative electrode of the electrochemical cell and the load, and configured to turn on or turn off a charge and discharge of the electrochemical cell, wherein the switching transistor group comprises a main circuit part, a sampling part, a first connection terminal connected to the negative electrode of the electrochemical cell, a second connection terminal connected to the load, and at least one control terminal, wherein the first connection terminal and the second connection terminal are respectively connected to an input terminal and an output terminal of the main circuit part, and the at least one control terminal is connected to the at least one charge and discharge protection terminal, and is configured to receive a control signal of the protection IC to control turn-off of the switching transistor group to implement protection against an abnormality of the electrochemical cell; and a sampling detection resistor Rs, serially connected between the sampling part and the current sampling detection output terminal, and configured to detect a current of the sampling part, wherein the input terminal or the output terminal of the main circuit part is connected to the positive current detection terminal, and a connection terminal of the sampling part is connected to the negative current detection terminal, wherein the switching transistor group comprises (X+KX) switching transistor units that are connected in parallel; X switching transistor units are connected in parallel to form the sampling part; KX transistors are connected in parallel to form the main circuit part, wherein X is an integer greater than 1, K is greater than 1, and KX is an integer.

14. The power protection apparatus according to claim 13, wherein the protection IC is configured to enable the negative current detection terminal and the positive current detection terminal to have a same potential, so that a current passing through the sampling part of the switching transistor group is equally proportional to a current passing through the main circuit part of the switching transistor group.

15. The power protection apparatus according to claim 13, wherein a ratio of the current passing through the sampling part to the current passing through the main circuit part is equal to a ratio of a quantity of switching transistor units of the sampling part to a quantity of switching transistor units of the main circuit part, that is, is equal to 1:K.

16. The power protection apparatus according to claim 15, wherein the switching transistor group comprises a sampling output terminal $SS_1$ connected to the connection terminal of the sampling part, and a main circuit detection output terminal $S_{1k}$ connected to the input terminal of the main circuit part, the $S_{1k}$ is connected to a positive input pin of the protection IC, the $SS_1$ is connected to both the negative current detection terminal and the current sampling detection output terminal of the protection IC, and the sampling detection resistor Rs is serially connected between the $SS_1$ and the current sampling detection output terminal of the protection IC.

17. The power protection apparatus according to claim 15, wherein the switching transistor group comprises a sampling output terminal $SS_1$ and a sampling detection output terminal $SS_{1k}$ that are connected to the connection terminal of the sampling part, and a main circuit detection output terminal $S_{1k}$ connected to the output terminal of the main circuit part, the $SS_1$ is connected to the current sampling detection output terminal of the protection IC, the $SS_{1k}$ is connected to the negative current detection terminal of the protection IC, and the sampling detection resistor Rs is serially connected between the $SS_1$ and the current sampling detection output terminal of the protection IC.

18. The power protection apparatus according to claim 15, wherein each switching transistor unit comprises one switching transistor or two switching transistors that are reversely connected in parallel, each of the at least one switching transistor is connected to a diode D1 in parallel, the X switching transistor units are connected in parallel to form the sampling part of the switching transistor group, and the KX switching transistor units are connected in parallel to form the main circuit part of the switching transistor group.

19. The power protection apparatus according to claim 18, wherein D electrodes of all switching transistors are connected together, G electrodes of all switching transistors that are connected in parallel are connected together to form the at least one control terminal, S electrodes of all switching transistors connected in parallel in the X switching transistor units constituting the sampling part of the switching transistor group are connected to a same pin to form a sampling output terminal $SS_1$ connected to the sampling part of the switching transistor unit, and S electrodes of all switching transistors connected in parallel in the KX switching transistor units constituting the main circuit part of the switching transistor group are connected to a same pin to form the first connection terminal or the second connection terminal of the switching transistor group.

20. The power protection apparatus according to claim 19, wherein a sampling detection output terminal $SS_{1k}$ is formed by directly connecting, by using a high-conductivity metal wire, the S electrodes on wafers of all the switching transistors connected in parallel in the X switching transistor units of the sampling part of the switching transistor group, and the detection output terminal $S_{1k}$ is formed by directly connecting the S electrodes on wafers of all Sa's or Sb's or switching transistors of the KX switching transistor units of the main circuit part of the switching transistor group by using a high-conductivity metal wire.

* * * * *